US008900907B2

(12) United States Patent
Pautet et al.

(10) Patent No.: US 8,900,907 B2
(45) Date of Patent: Dec. 2, 2014

(54) METHOD FOR MANUFACTURING AN ELECTROMAGNETIC RADIATION DETECTOR AND DETECTOR OBTAINED BY A GROWTH SUBSTRATE REMOVAL METHOD

(75) Inventors: Christophe Pautet, Saint Marcel Bel Accueil (FR); Arnaud Etcheberry, Colombes (FR); Alexandre Causier, Ferrieres Saint Hilaire (FR); Isabelle Gerard, Gif sur Yvette (FR)

(73) Assignees: Societe Francaise de Detecteurs Infrarouges-Sofradir, Chatenay Malabry (FR); Centre National de la Recherche Scientifique, Paris (FR)

( * ) Notice: Subject to any disclaimer, the term of this patent is extended or adjusted under 35 U.S.C. 154(b) by 98 days.

(21) Appl. No.: 13/529,256

(22) Filed: Jun. 21, 2012

(65) Prior Publication Data
US 2013/0005068 A1    Jan. 3, 2013

(30) Foreign Application Priority Data

Jun. 30, 2011    (FR) ...................................... 11 02031

(51) Int. Cl.
| | |
|---|---|
| H01L 21/00 | (2006.01) |
| H01L 27/146 | (2006.01) |
| H01L 31/18 | (2006.01) |
| H01L 31/0296 | (2006.01) |

(52) U.S. Cl.
CPC ........ *H01L 27/1465* (2013.01); *H01L 31/1832* (2013.01); *Y02E 10/50* (2013.01); *H01L 27/14696* (2013.01); *H01L 31/1892* (2013.01); *H01L 31/02966* (2013.01)
USPC ........................ 438/57; 438/58; 257/E31.004

(58) Field of Classification Search
CPC ..................... H01L 27/1465; H01L 27/14696; H01L 31/1832; H01L 31/1892; H01L 31/02966; Y02E 10/50
USPC ............................... 438/57, 58; 257/E31.004
See application file for complete search history.

(56) References Cited

U.S. PATENT DOCUMENTS

| | | | | |
|---|---|---|---|---|
| 4,600,469 A | * | 7/1986 | Fusco et al. | 438/692 |
| 4,783,594 A | * | 11/1988 | Schulte et al. | 250/370.08 |
| 5,366,934 A | * | 11/1994 | La Chapelle, Jr. | 438/694 |
| 5,536,680 A | * | 7/1996 | Ehmke | 438/59 |
| 5,751,049 A | * | 5/1998 | Goodwin | 257/440 |

(Continued)

OTHER PUBLICATIONS

V.G. Ivanits'ka, et al., "*Chemical Polishing of CdTe and CdZnTe in Iodine-Methanol Etching Solutions*," Journal of Electronic Materials, vol. 40, No. 8, May 6, 2011, pp. 1802-1808.

(Continued)

*Primary Examiner* — Caleb Henry
(74) *Attorney, Agent, or Firm* — Burr & Brown, PLLC

(57) ABSTRACT

A method for removing the growth substrate of a circuit of electromagnetic radiation detection, especially in the infrared or visible range, said detection circuit including a layer of detection of said radiation made of $Hg_{(1-x)}Cd_xTe$ obtained by liquid or vapor phase epitaxy or by molecular beam epitaxy, said detection circuit being hybridized on a read circuit. The method includes submitting the growth substrate to a mechanical or chem.-mech. polishing step or to a chemical etch step to decrease its thickness, all the way to an interface area between the material of the detection circuit and the growth substrate; and submitting the interface thus obtained to an iodine treatment.

9 Claims, 1 Drawing Sheet

(56) References Cited

U.S. PATENT DOCUMENTS

| | | | |
|---|---|---|---|
| 5,861,626 A * | 1/1999 | Chandra et al. | 250/338.4 |
| 5,916,375 A * | 6/1999 | Agui et al. | 136/258 |
| 5,920,798 A * | 7/1999 | Higuchi et al. | 438/761 |
| 6,049,116 A * | 4/2000 | Park et al. | 257/442 |
| 6,208,005 B1 * | 3/2001 | Mitra | 257/442 |
| 6,359,290 B1 * | 3/2002 | Ehmke | 257/55 |
| 6,572,782 B2 * | 6/2003 | Campo et al. | 216/75 |
| 6,700,111 B2 * | 3/2004 | Shigenaka et al. | 250/208.1 |
| 6,790,701 B2 * | 9/2004 | Shigenaka et al. | 438/93 |
| 8,053,734 B2 * | 11/2011 | Kirby et al. | 250/353 |
| 2002/0030035 A1 * | 3/2002 | Dieguez et al. | 216/63 |
| 2003/0160172 A1 * | 8/2003 | Ashokan et al. | 250/338.4 |
| 2006/0118869 A1 * | 6/2006 | Lan et al. | 257/347 |
| 2008/0149179 A1 * | 6/2008 | Romeo et al. | 136/264 |
| 2008/0203514 A1 * | 8/2008 | Szeles | 257/442 |
| 2009/0085045 A1 * | 4/2009 | Marion et al. | 257/79 |
| 2009/0269271 A1 * | 10/2009 | Suzuki et al. | 423/509 |
| 2010/0126580 A1 * | 5/2010 | Farrell et al. | 136/256 |
| 2010/0140735 A1 * | 6/2010 | Bommena et al. | 257/506 |
| 2010/0276598 A1 * | 11/2010 | Kirby et al. | 250/353 |

OTHER PUBLICATIONS

French Search Report dated Feb. 7, 2012.

* cited by examiner

METHOD FOR MANUFACTURING AN ELECTROMAGNETIC RADIATION DETECTOR AND DETECTOR OBTAINED BY A GROWTH SUBSTRATE REMOVAL METHOD

BACKGROUND OF THE INVENTION

Field of the Invention

The present disclosure relates to electromagnetic radiation detectors, and more specifically to a method for manufacturing such a detector.

The present disclosure more specifically relates to the infrared spectral range, and to especially to near infrared, as well as to the visible range.

Electromagnetic radiation detectors are conventionally formed of an electronic circuit for detecting electromagnetic waves to be detected, and thus sensitive to the corresponding wavelength range, continuously turning, in known fashion, an electromagnetic radiation into an electric signal. Such a detection circuit is associated with an electronic read circuit intended to transform the electric signals generated by the detection circuit, especially by amplifying them to make them capable of undergoing a subsequent processing.

The present invention more specifically aims at detectors formed of a detection circuit hybridized with a read circuit, typically made of silicon, by the well-known flip-chip technology, using hybridization bumps or microbumps, and detecting the concerned radiation from the back side.

The considered detectors comprise those having their detection circuit formed based on an alloy of generic formula HgCdTe, which material is well known for its absorption of infrared electromagnetic radiation. This material is conventionally obtained by liquid or vapor phase epitaxy, or by molecular beam epitaxy based on a substrate formed of a solid CdZnTe alloy or, as a variation, on a semiconductor substrate of Si, Ge, or AsGa type on which a mesh parameter adaptation layer based on CdTe or CdZnSeTe has previously been deposited. In the following description, and unless otherwise specified, this substrate, be it made of solid CdZnTe or of a semiconductor coated with an CdTe or CdZnSeTe layer, will be identified by generic formula Cd(Zn)Te.

Such a Cd(Zn)Te substrate has a thickness which is likely to vary, typically between 200 and 800 micrometers. It is little absorbing for the radiation to be detected, especially for infrared. It however raises an issue when the detector is desired to be sensitive to near infrared or to the visible range.

Indeed, the Cd(Zn)Te substrate absorbs the incident radiation in the near infrared or visible wavelength ranges, whereby the detected signal is decreased and by no means fulfils its purpose.

The same issue arises in astronomy, for the same reasons, since such a Cd(Zn)Te substrate also absorbs the cosmic radiation, which is then re-emitted in wavelengths for which the HgCdTe absorbing material becomes sensitive, which results in the creation of unwanted ghost images.

To do away which such difficulties, it is thus desirable to be able to remove the Cd(Zn)Te growth substrate after hybridization of the detection circuit on the read circuit.

For this purpose, a known method comprises, after the step of hybridization of the detection circuit on the read circuit, performing a mechanical or chem.-mech. polishing of the Cd(Zn)Tc substrate, to take it down from its nominal thickness of a few hundreds of micrometers to a thickness of a few tens of micrometers, typically between 5 and 80 micrometers.

Such a polishing step may be continued or replaced by a step of chemical etching with solutions selectively etching CdZnTe over HgCdTe. The selectivity of the etching of CdZnTe over HgCdTe by chemical solutions is due to the difference in mercury and cadmium composition between the two materials at their interface.

This selectivity decreases when the composition of the material becomes closer to that of the CdZnTe substrate.

Experience shows that the composition limit for which the chemical etch selectivity of the CdZnTe material over the HgCdTe material remains exploitable is reached at a cadmium atomic composition of x=0.5, the HgCdTe material being described by formula $Hg_{(1-x)}Cd_xTe$.

There is a gradual composition transition between the CdZnTe substrate and the $Hg_{(1-x)}Cd_xTe$ material. Indeed, during the epitaxial growth of the detection layer made of the $Hg_{(1-x)}Cd_xTe$ alloy on the Cd(Zn)Te substrate, a cadmium composition gradient between the active $Hg_{(1-x)}Cd_xTe$ layer and the substrate is created, which results:

either from the interdiffusion between the $Hg_{(1-x)}Cd_xTe$ epitaxy and the CdZnTe substrate in the context of the liquid phase epitaxy;

or from the continuous adjustment of the growth parameters in molecular beam epitaxy or in vapor phase epitaxy.

The fact for the transition between the substrate and the absorbing material to be gradual, associated with the lack of selectivity of the chemical etching, thus implies that part of the composition gradient generated during the epitaxy disappears during the chemical etching of the CdZnTe substrate.

The conventional method of removal of the CdZnTe by chemical or chem.-mech. polishing, followed by a chemical etching, provides highly functional detectors with controlled manufacturing efficiencies for mercury-rich compositions of photosensitive $Hg_{(1-x)}Cd_xTe$ materials, that is, with $x_{cd} < 0.4$.

In visible wavelengths, the absorption coefficient of the $Hg_{(1-x)}Cd_xTe$ material approximately ranges between a few $10^4$ and $10^5$ cm$^{-1}$: in other words, most of the radiation of interest is very quickly absorbed (a few hundreds of nanometers).

The absorption of a photon close to the rear surface of the layer of $Hg_{(1-x)}Cd_xTe$ detection material creates an electron-hole pair (photocarriers).

In the case of mercury-rich $Hg_{(1-x)}Cd_xTe$, the residual cadmium composition gradient and the potential gradients of the associated conduction and valence bands are sufficient to drive photocarriers away from the back side without for them to recombine on the recombination centers located at the surface (unsatisfied dangling bonds, defects . . . ). Photocarriers can then diffuse to the front surface, where they are collected by the read circuit.

In the case of lower $Hg_{(1-x)}Cd_xTe$ mercury compositions ($x_{cd} > 0.4$), the residual composition gradient and the associated potential gradients become insufficient to drive photocarriers away from the rear surface, so that said photo-carriers recombine on the recombination centers located at the surface.

Now, the photocarrier recombination affects the photocarriers all the more as they are generated close to the surface, and thus as they correspond to photons of short wavelengths having the highest absorption coefficient. A loss of sensitivity in low wavelengths, which varies according to the detector areas, can thus be observed.

In other words, the composition gradient resulting from the epitaxy between the Cd(Zn)Te substrate and the HgCdTe detection material generates a bandgap gradient which repels photocarriers towards the back side, so that the detection functionality is not impacted by possible recombination centers located at the surface of the HgCdTe material for a mercury atomic composition greater than 0.6.

Conversely, methods of removal of the CdZnTe growth substrate are not sufficiently selective between CdZnTe and HgCdTe, which generate a partial or total disappearing of the cadmium composition gradient (and complementarily, of the same for mercury) generated during the epitaxy, so that the recombination centers located at the surface of the HgCdTe material cause a recombination of the carriers photogenerated close to the back side, thus inducing a loss of sensitivity of the detector in low wavelengths.

The present invention aims at overcoming these issues.

SUMMARY OF THE INVENTION

Thus, the present invention first aims at a specific method capable of processing the back side of the detection layer made of HgCdTe of a detection circuit hybridized on a read circuit, after conventional mechanical or chem.-mech. processes and/or, as an alternative, chemical etch processes, tending to remove the CdZnTe growth substrate, in order to suppress the recombination centers present on said surface and, thereby, to avoid the recombination of photocarriers with said recombination centers.

Thus, the present invention aims at a method for removing the CdZnTe growth substrate of a circuit of electromagnetic radiation detection, especially in the infrared or visible range, made of $Hg_{(1-x)}Cd_xTe$ by liquid or gaseous epitaxy or by molecular beam epitaxy, said detection circuit being hybridized on a read circuit, and for subsequently processing the interface between the growth substrate and the detection material obtained consecutively to the removal of said growth substrate.

This method comprises submitting the growth substrate to a mechanical or chem.-mech. polishing or to a chemical etching to remove said substrate, and then submitting the assembly thus obtained to an iodine treatment.

In other words, the present invention comprises implementing conventional growth substrate removal methods, especially by mechanical or chem.-mech. polishing, and/or by chemical etching, and then, after performing these conventional steps, submitting the assembly to a chemical iodine treatment, especially by immersion in a bath of adequate composition, typically in an acid is aqueous $KI/I_2/HBr$ or $HI/I_2$ solution.

Thus, the processing of the component obtained after implementation of a conventional mechanical or chem.-mech. polishing, and/or a conventional chemical etching, by an aqueous solution, for example, of $KI/I_2/HBr$, results in the forming of a very thin surface elementary iodine film, directly cross-linked on the surface and time- and temperature-stable.

Such a surface film enables to suppress, or at least to neutralize, the recombination centers present at the surface of the HgCdTe absorbing material: in other words, the iodine film induces the passivation of said surface.

The bath may also be formed of molecular iodine dissolved in alcohol, and especially $I_2$-MeOH.

It may be envisaged to submit said growth substrate to a chemical etching in order to remove the residual CdZnTe thickness, prior to the chemical acid iodine treatment, but subsequently to the polishing.

In any event, the method of the present invention aims at passivating the back side of the HgCdTe material while etching it as little as possible.

The foregoing and other features and advantages of the present invention will be discussed in the following non-limiting description of a specific embodiment in connection with the accompanying drawings.

DETAILED DESCRIPTION OF THE INVENTION

Figure 1A:
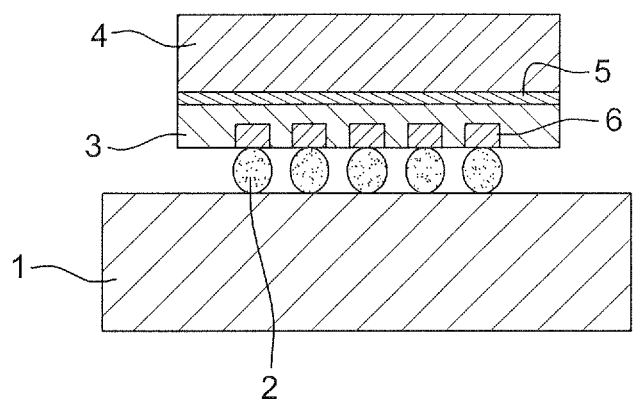
FIGS. 1A to 1C are simplified cross-section views of an electromagnetic radiation detector according to the present invention, illustrating the different steps of the method for removing the CdZnTe growth substrate from the HgCdTe detection material.

The detection circuit of the present invention is formed of a layer 3 of an HgCdTe alloy, obtained by metallurgical growth on a support 4 transparent to infrared radiation. Growth substrate or support 4 is, in the described example, made of a CdZnTe alloy. It may as a variation be replaced with a single-crystal semiconductor substrate (Si, Ge, or AsGa) on which, prior to the growth phase, a CdTe-based mesh adaptation layer having a thickness of a few micrometers has been deposited. The material forming this layer may for example be a quaternary alloy of CdSeZnTe type.

The growth is performed by liquid phase, vapor phase, or even molecular beam epitaxy.

This growth method results in the creation, between actual absorbing layer 3 and CdZnTe substrate 4, of a cadmium composition variation area 5 located, in a way, at the interface between area 3 and substrate 4. In other words, area 5 is located at the interface between the growth substrate and absorbing area 3.

In the case where the growth is obtained by liquid epitaxy, the composition variation area is an interdiffusion area, which is not clearly delimited.

The other surface of absorbing layer 3, that is, opposite to composition variation area 5, has diodes 6 formed thereon.

The connection of the detection circuit formed by assembly 3, 4, 5 with a read circuit 1, typically made in silicon technology, is obtained by the well-known hybridization technology, by means of bumps or microbumps, especially made of indium 2, and for example such as described in document FR A 2 646 558.

Such microbumps 2 ensure both the positive mechanical connection of the detection assembly to read circuit 1 and the electric conduction enabling to transfer electric signals resulting from the interaction of electromagnetic radiation with the detection circuit to the read circuit.

As indicated as a preamble, the detector of the present invention provides a backside detection, that is, which is performed from the back side of the circuit of detection area 3. For this purpose, Cd(Zn)Te growth substrate 4 of said detection layer 3 should thus be removed.

Thus, after hybridization of detection circuit 3, 4, 5 on silicon read circuit 1 (FIG. 1a), a first step of chem.-mech. polishing of Cd(Zn)Te substrate 4 is carried out. This polishing may also be replaced with a mechanical lapping step. This step enables to suppress much of the thickness of the Cd(Zn)Te support and may further go along with a first chemical action by means of an etch solution, selective between HgCdTe and Cd(Zn)Te. Such a solution is for example formed of a hydrofluoric acid, nitric acid, and acetic acid bath.

Under the assumption that the growth substrate is formed of a single-crystal semiconductor on which a layer of CdTe material has been deposited, the suppression of said substrate may be initiated by simple chemical action, selective between the considered semiconductor and the CdTe-based layer.

Figure 1B:
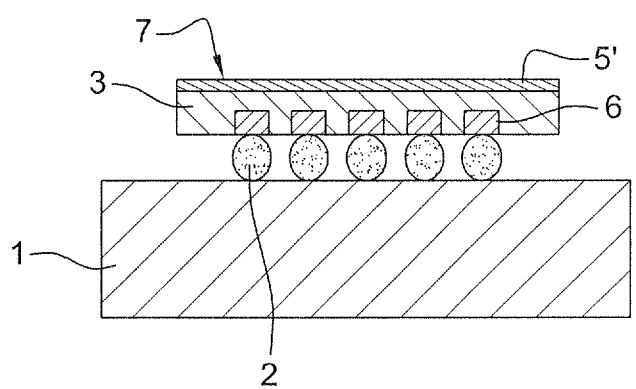
Figure 1C:
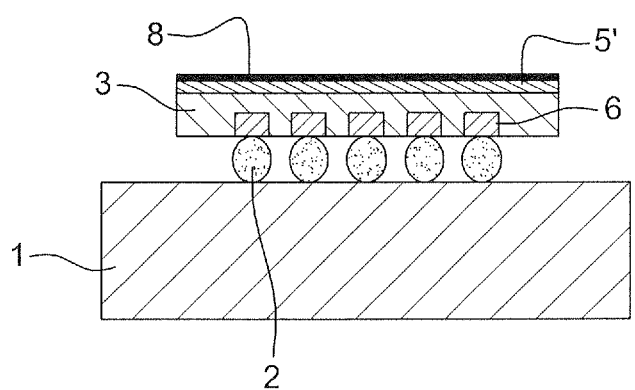

This results in the simplified view of FIG. 1b where only residual composition variation area 5' remains, in contact with absorbing material area or detection layer 3 made of $Hg_{(1-x)}Cd_xTe$. This area is called residual since it has been submitted to a partial etching, either mechanical or chemical, during the previous step.

Free surface 7 of area 5' exhibits a number of active recombination centers which raise an issue for near infrared or visible detection, as discussed as a preamble.

The assembly formed by the detection circuit, hybridized on the read circuit, may then be first submitted to a deoxidizing of the surface of said area 5' by immersion into 1M hydrochloric acid.

After rinsing of the assembly in deionized water, the same assembly is then submitted to a treatment for a time period varying from a few seconds to a few minutes or to a few tens of minutes in an iodized etch solution, by immersion. This solution typically has the following composition:

molecular iodine: from $10^{-1}$ to $10^{-5}$ M;
hydrobromic acid: HBr, from 0.09 M to 9 M;
deionized water.

The hydrobromic acid may also be replaced with hydriodic acid HI, also from 0.09 M to 9M, or by hydrochloric acid HCl having the same molarity.

It may also be envisaged to introduce in the solution potassium iodide KI from 8M to 0M, having the function of accelerating the dissolution of iodine $I_2$ and of stabilizing the solution.

With such a solution, an etch speed of the upper layers of residual composition variation area 5' typically ranging between 1 and 6,000 nanometers per minute can be observed.

Subsequently, after rinsing for approximately five minutes in deionized water and nitrogen blowing, one can observe the forming of a very thin surface film 8 formed of iodine directly chemically bonded by covalent bond to the surface of residual composition variation area 5', opposite to the hybridized surface on the read circuit.

Thin film 8 behaves as a passivation layer and actually inhibits the active recombination centers traditionally present at the surface of residual composition variation area 5' resulting from conventional methods of thinning or removal of the CdZnTe growth substrate.

The forming of this very thin iodine film 8 (typically one atomic monolayer) at the surface of residual composition variation area 5' is especially observable by the modification of the XPS (X-RAY PHOTOELECTRON SPECTROSCOPY) spectrums, which shows an offset of the energy peaks of cadmium 3d and of mercury 4f characteristic of the creation of covalent bonds between the iodine and, respectively, the cadmium and the mercury forming the material of residual composition variation area 5'.

It should be noted that the surface modification of said layer by acid treatment can also be detected by ellipsometry, that is, by the optical technique of characterization and surface analysis based on the light polarization change, by reflection of light on the planar surface of a sample; this ellipsometry analysis results in the modification of the real and imaginary optical indexes of $Hg_{(1-x)}Cd_xTe$.

Exposing the component thus obtained to high temperatures, typically for 10 min at 145° C., does not modify the processed surface and thus shows the time- and temperature-stability of iodized surface network 8.

This result is perfectly advantageous since it enables to implement thermal treatments subsequent to the removal of Cd(Zn)Te substrates without for all this losing the benefit of the surface passivation by iodine.

This accordingly enables to integrate the iodine treatment in sequences of technological processes involved in the manufacturing of infrared components, and especially cooled infrared components.

In terms of detection properties, the obtaining of such a passivation enables to decrease the vulnerability of the detector to the partial or total disappearing of the composition gradient between the Cd(Zn)Te substrate and the active detection layer made of $Hg_{(1-x)}Cd_xTe$ material in the selective chemical etch step. Thereby, the photocarriers originating from the photons having the shortest wavelengths, typically from 400 to 800 nanometers, which are absorbed close to the surface, no longer recombine on the back side of the detection circuit, and can then be collected by the read circuit.

In the previously-mentioned example, a specific composition of the iodized solution in an acid medium has been used. Potassium iodide may be replaced with potassium iodate $KIO_3$.

The present invention also aims at any method where molecular iodine forms and/or is stabilized, such as for example a system having an alcohol as a solvent, instead of water as in the previously-described example. What matters is to have available molecular iodine in the solution.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method for removing the growth substrate of a circuit of electromagnetic radiation detection, especially in the infrared or visible range, said detection circuit comprising a layer of detection of said radiation made of $Hg_{(1-x)}Cd_xTe$ obtained by one of liquid phase epitaxy, vapor phase epitaxy and molecular beam epitaxy, said detection circuit being hybridized on a read circuit, said method comprising:

submitting the growth substrate to one of a mechanical polishing step, a chemical-mechanical polishing step and a chemical etch step to decrease its thickness, all the way to an interface area between the material of the detection circuit and the growth substrate; and submitting the interface thus obtained to an iodine treatment carried out in an acid medium.

2. The method for removing the growth substrate of an electromagnetic radiation detection circuit of claim 1, wherein iodine is present in molecular form in solution and wherein its solvent is water.

3. The method for removing the growth substrate of an electromagnetic radiation detection circuit of claim 1, wherein the iodine treatment is performed by general immersion of the detector resulting from at least one of the mechanical and chemical-mechanical polishing steps and from the chemical etching in a bath having the following composition:

molecular iodine: from $10^{-1}$ to $10^{-5}$ M;
hydrobromic acid HBr or hydriodic acid HI from 0.09 to 9 M; and
deionized water.

4. The method for removing the growth substrate of an electromagnetic radiation detection circuit of claim 3, wherein the iodine treatment in the acid medium follows an action of deoxidation of a surface of the residual composition variation area obtained after at least one of a mechanical polishing step, a chemical-mechanical polishing step and a step of chemical etching by submitting the assembly to a hydrochloric acid bath.

5. The method for removing the growth substrate of an electromagnetic radiation detection circuit of claim 1, wherein the iodine treatment is performed by general immersion of the detector resulting from at least one of the mechanical and chemical-mechanical polishing steps and from the chemical etching in a bath having the following composition:

molecular iodine: from $10^{-1}$ to $10^{-5}$ M;

hydrochloric acid HCl from 0.09 to 9 M; and deionized water.

6. The method for removing the growth substrate of an electromagnetic radiation detection circuit of claim 1, wherein iodine is present in molecular form in solution and wherein its solvent is alcohol, and especially $I_2$-MeOH.

7. The method for removing the growth substrate of an electromagnetic radiation detection circuit of claim 1, wherein the growth substrate is formed of a solid Cd(Zn)Te material.

8. The method for removing the growth substrate of an electromagnetic radiation detection circuit of claim 1, wherein the growth substrate is formed of a single-crystal semiconductor on which a CdTe-based mesh parameter adaptation layer having a thickness of a few micrometers has previously been deposited.

9. The method for removing the growth substrate of an electromagnetic radiation detection circuit of claim 1, wherein prior to submitting the assembly to the iodine treatment, but subsequently to one of the mechanical polishing step, the chemical-mechanical polishing step and the chemical etch step, said assembly is submitted to a chemical etching to remove the residual thickness of the growth substrate.

* * * * *